United States Patent [19]
Vulih et al.

[11] Patent Number: 6,016,067
[45] Date of Patent: *Jan. 18, 2000

[54] SAMPLE-AND-HOLD CIRCUIT HAVING REDUCED AMPLIFIER OFFSET EFFECTS AND RELATED METHODS

[75] Inventors: Salomon Vulih, Neshamic Station; Donald R. Preslar, Somerville, both of N.J.; Thomas A. Jochum, Durham, N.C.

[73] Assignee: Intersil Corporation, Palm Bay, Fla.

[*] Notice: This patent is subject to a terminal disclaimer.

[21] Appl. No.: 09/055,562

[22] Filed: Apr. 6, 1998

[51] Int. Cl.[7] .......................... H03K 17/00; G11C 27/02
[52] U.S. Cl. ................................ 327/94; 327/96; 327/95
[58] Field of Search ................................ 327/91, 93, 94, 327/95, 96; 341/122, 123, 124, 125

[56] References Cited

U.S. PATENT DOCUMENTS

| | | | |
|---|---|---|---|
| 4,308,468 | 12/1981 | Olson | 327/94 |
| 4,667,178 | 5/1987 | Ryu . | |
| 4,862,016 | 8/1989 | Genrich | 327/94 |
| 4,935,702 | 6/1990 | Mead et al. . | |
| 5,142,238 | 8/1992 | White . | |
| 5,180,965 | 1/1993 | Nose . | |
| 5,243,235 | 9/1993 | Wakayama et al. . | |
| 5,258,664 | 11/1993 | White | 327/91 |
| 5,286,663 | 2/1994 | Manning . | |
| 5,481,212 | 1/1996 | Shima | 327/94 |
| 5,546,022 | 8/1996 | D'Souza et al. . | |
| 5,583,821 | 12/1996 | Rose et al. . | |
| 5,593,907 | 1/1997 | Anjum et al. . | |
| 5,594,265 | 1/1997 | Shimizu et al. . | |
| 5,663,586 | 9/1997 | Lin . | |
| 5,696,396 | 12/1997 | Tokura et al. . | |

*Primary Examiner*—Timothy P. Callahan
*Assistant Examiner*—An T. Luu
*Attorney, Agent, or Firm*—Allen, Dyer, Doppelt, Milbrath & Gilchrist, P.A.

[57] ABSTRACT

An integrated circuit sample-and-hold (S/H) circuit includes an amplifier offset compensation circuit for compensating for the D.C. offset of a buffer amplifier. The amplifier offset compensation circuit may include an offset determining circuit for determining an offset voltage generated by the buffer amplifier, and an offset correction circuit for generating an offset correction signal and coupling the offset correction signal to the buffer amplifier. The S/H circuit may include a substrate, a sampling capacitor formed on the substrate, and a first field-effect transistor (FET) formed on the substrate. The first FET may have a first conduction terminal for receiving the input signal, a second conduction terminal connected to the sampling capacitor, and a control terminal responsive to control signals for connecting the input signal to the first sampling capacitor during a sampling time and for disconnecting the input signal from the first sampling capacitor during a holding time. The first FET may further include a body creating a parasitic diode-connected to the first sampling capacitor. To address this parasitic diode, the circuit includes the buffer amplifier having an input connected to the first sampling capacitor and an output connected to the body of the first FET during the holding time. The offset of the buffer amplifier is compensated.

48 Claims, 4 Drawing Sheets

SAMPLE-AND-HOLD CIRCUIT HAVING REDUCED AMPLIFIER OFFSET EFFECTS AND RELATED METHODS

FIELD OF THE INVENTION

The present invention relates to electronic circuits, and more particularly, to a sample-and-hold circuit and related methods.

BACKGROUND OF THE INVENTION

Sample-and-hold (S/H) circuits are widely used, for example, to store an analog voltage signal accurately over a time period ranging typically from as little as a few microseconds to as long as several minutes. A S/H circuit may be considered as a switched capacitor network, wherein the input signal is sampled to a sampling capacitor during a sampling time, and is held on the capacitor during the holding time. Since the analog voltage across the sampling capacitor in the hold time should be available at the output terminal of the circuit even under low impedance, an output buffer amplifier is typically connected to the sampling capacitor.

The main desired characteristics of a S/H circuit may be a low hold mode voltage droop, short settling time in the acquisition or sampling mode, a low offset voltage, and hold-mode feedthrough. The hold mode droop is dependent on the leakage current from the sampling capacitor to the various components connected thereto.

In one type of S/H circuit a transmission gate in the form of a field-effect transistor (FET) samples the input voltage onto the sampling capacitor. An output amplifier reads the voltage from the sampling capacitor. The sampling capacitor may also be formed in the same semiconductor substrate as the FET. Accordingly, a parasitic diode may be formed by the body of the FET and the sampling capacitor. The parasitic diode may cause voltage droop or an inaccurate voltage for the output of the S/H circuit.

SUMMARY OF THE INVENTION

In view of the foregoing background, it is therefore an object of the present invention to provide a S/H circuit and related methods which reduces the droop during relatively long holding times.

It is another object of the present invention to provide a S/H circuit and related methods which reduces droop, as may be caused by caused by a D.C. offset of the buffer amplifier.

It is yet another object of the present invention to provide a S/H circuit and related methods which reduces droop, as may be caused by caused by an input switching transistor.

These and other objects, features and advantages in accordance with the present invention are provided by an integrated S/H circuit which comprises amplifier offset compensation means for compensating for the D.C. offset of a first buffer amplifier. The amplifier offset compensation means may comprise offset determining means for determining an offset voltage generated by the first buffer amplifier, and offset correction means for generating an offset correction signal responsive to the offset determining means and coupling the offset correction signal to the first buffer amplifier.

More particularly, the S/H circuit may include a substrate, a first sampling capacitor formed on the substrate, and a first field-effect transistor (FET) formed on the substrate. The first FET may have a first conduction terminal for receiving the input signal, a second conduction terminal connected to the first sampling capacitor, and a control terminal responsive to control signals for connecting the input signal to the first sampling capacitor during a sampling time, and for disconnecting the input signal from the first sampling capacitor during a holding time.

As explained above, the first FET may further include a body creating a parasitic diode connected to the first sampling capacitor. To address this parasitic diode, the circuit may include the first buffer amplifier having an input connected to the first sampling capacitor and an output connected to the body of the first FET during the holding time. The first buffer amplifier applies a holding voltage from the first sampling capacitor to the body of the first FET to thereby reduce undesired effects from the parasitic diode.

The first buffer amplifier may comprise a pair of inputs. Accordingly, the offset determining means may comprise means for connecting both inputs to the input voltage during a determination of the offset voltage. The offset determining means may preferably comprise storing means for storing the offset voltage of the first buffer amplifier, and the storing means may be provided by a second S/H circuit including a second sampling capacitor and a second buffer amplifier.

The offset correction means may further comprise a differential amplifier having a first input connected to the second sampling capacitor, a second input connected to a reference voltage, and a pair of differential outputs connected to the first buffer amplifier. In addition, the amplifier offset compensation means may include null sample means for sampling the offset voltage during a null time which occurs during the sample time and which may be relatively brief, such as, for example, less than about 10 microseconds.

Another aspect of the invention relates to compensating for the subthreshold conduction current of the first FET. Accordingly, the integrated S/H circuit may further comprise subthreshold conduction current compensation means for reducing undesired effects of subthreshold conduction current in the first FET during the holding time. The subthreshold conduction current compensation means may cause a voltage at the first conduction terminal of the first FET to be substantially equal to a voltage at the second conduction terminal of the first FET during the holding time.

The S/H circuit may include a second FET having a first conduction terminal connected to the input signal, a second conduction terminal connected to the first conduction terminal of the first FET, and a control terminal responsive to control signals for connecting the input signal to the first sampling capacitor during the sampling time and for disconnecting the input signal from the first sampling capacitor during the holding time. In this embodiment, the subthreshold conduction current compensation means preferably further comprises means for connecting the holding voltage from the output of the first buffer amplifier to a node defined between the second conduction terminal of the second FET and the first conduction terminal of the first FET during the holding time.

A method aspect of the invention is for enhancing operation of an integrated S/H circuit for an input signal. The S/H circuit is preferably of a type comprising a first sampling capacitor, and a first FET having a first conduction terminal for receiving the input signal, a second conduction terminal connected to the first sampling capacitor, and a control terminal responsive to control signals for connecting the input signal to the first sampling capacitor during a sampling time and for disconnecting the input signal from the first sampling capacitor during a holding time. The S/H circuit may further include the first buffer amplifier having an input connected to the first sampling capacitor and an output connected to the body of the first FET during the holding time for applying a holding voltage from the first sampling capacitor to a body of the first FET. Unfortunately, the first buffer amplifier may have a D.C. offset. Accordingly, the method preferably comprises the step of compensating for the D.C. offset of the first buffer amplifier. The compensating step may comprise determining an offset voltage generated by the first buffer amplifier, and generating an offset correction signal responsive to the offset determining means and coupling the offset correction signal to the first buffer amplifier.

Another aspect of the invention addresses the subthreshold conduction current of the first FET. In other words, the method preferably further includes the step of reducing undesired effects of subthreshold conduction current, such as by causing a voltage at the first conduction terminal of the first FET to be substantially equal to a voltage at the second conduction terminal of the first FET during the holding time. For an embodiment wherein the S/H circuit further comprises a second FET having a first conduction terminal connected to the input signal, and a second conduction terminal connected to the first conduction terminal of the first FET, the step of compensating for the subthreshold conduction current preferably comprises connecting the holding voltage from the output of the first buffer amplifier to the node defined between the second conduction terminal of the second FET and the first conduction terminal of the first FET during the holding time.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
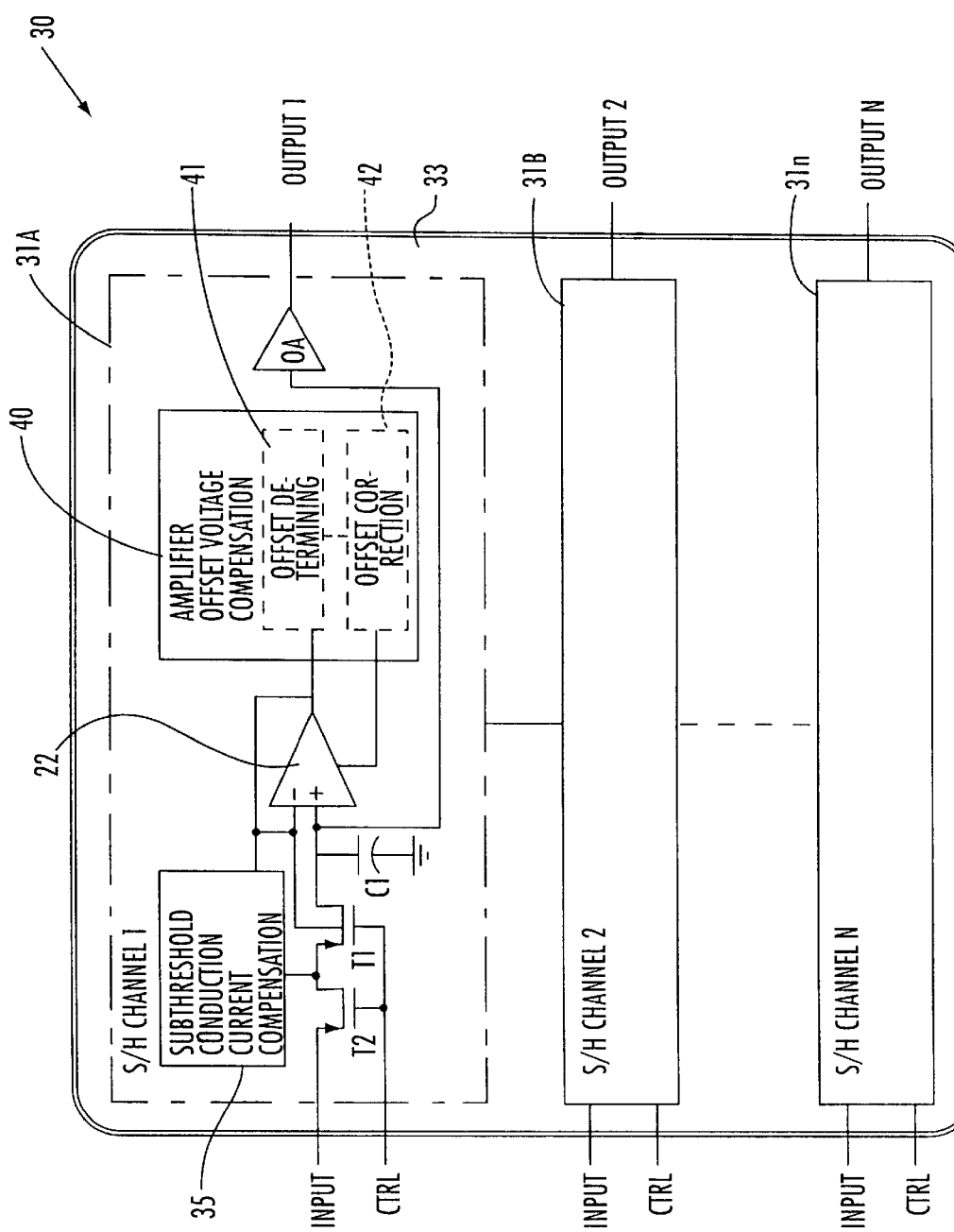
FIG. 1 is a schematic block diagram of an S/H integrated circuit device in accordance with the present invention and with a first S/H circuit portion shown in greater detail.
Figure 2:
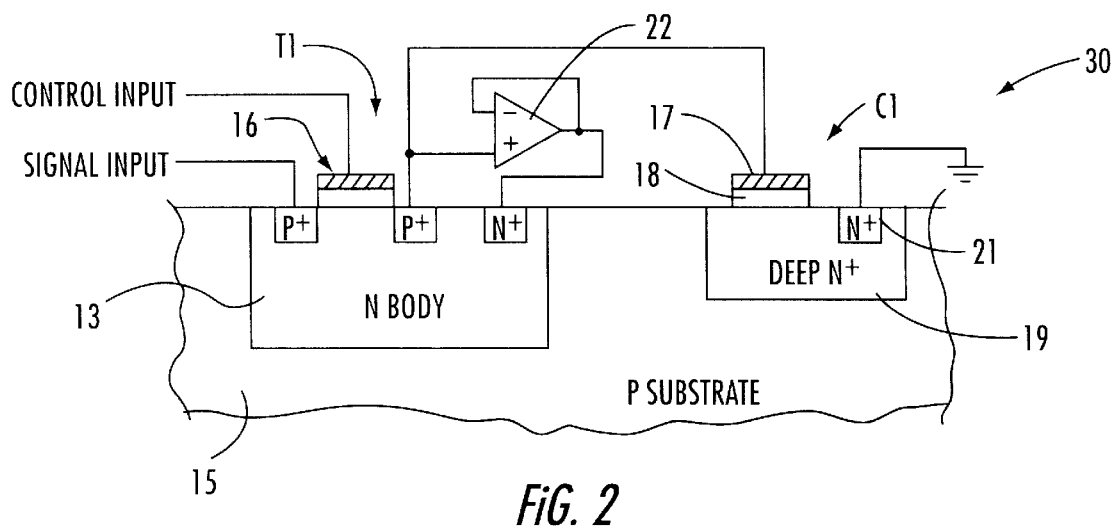
FIG. 2 is a cross-sectional and partially schematic diagram of a portion of the S/H circuit in accordance with the present invention.

Referring initially to FIGS. 1 and 2, an integrated circuit 30 according to the invention is now explained. The circuit 30 includes a plurality of individual S/H circuits 31a–31n for respective channels 1–N, and which are formed on a semiconductor substrate 33 as will be readily appreciated by those skilled in the art. The functional components of the first S/H circuit 31a are shown in greater detail, it being understood that the other S/H circuits 31b–31n include similar components. As will also be readily appreciated by those skilled in the art, the integrated S/H circuit as described further herein may be an individual circuit, or may also be combined with multiple such circuits, and/or other circuit components on the same substrate.

An output amplifier OA is connected to the sampling capacitor C1 to provide an output as will be readily appreciated by those skilled in the art. The illustrated integrated S/H circuit 31a also includes a pair of first and second FETs T1, T2 being connected in series, and to the sampling capacitor C1. The first and second FETs T1, T2 are controlled by control signals, to sample the input voltage to the sampling capacitor C1. A unity gain buffer amplifier 22 is connected between the body/well of the first FET T1 and the sampling capacitor C1 to thereby prevent the parasitic diode from affecting the charge on the capacitor during the holding time.

More particularly, as shown in FIG. 2, for a combination bipolar and complementary metal oxide semiconductor (BiCMOS) process, the first transmission gate or FET T1 is controlled to periodically sample the input voltage onto the sampling capacitor C1. The transistor T1 includes an N conductivity type body 13 formed in the P conductivity type substrate 15. The P+ doped regions provide the source and drain for the transistor T1. The gate 16 is controlled to sample the signal onto the sampling capacitor C1. The sampling capacitor C1, in turn, includes the deep N+ type region 19 formed in the substrate 15, and the conductive layer 17 on the dielectric layer 18. The N+ region 19 is illustratively coupled to ground by the N+ contact region 21.

To sample the voltage, the first transistor T1 is switched to a conductive state. Unfortunately, a problem occurs in that a parasitic diode is formed between the terminal which is connected to the sampling capacitor C1 and the background body/well 13. This parasitic diode is connected to the sampling capacitor C1 and would otherwise cause the capacitor to discharge or charge to the well potential when in the hold mode. In accordance with one advantageous aspect of the present invention, the problem of the parasitic diode is overcome by connecting the body/well 13 of the first switching MOS transistor T1 to a voltage equal to the voltage of the sampling capacitor C1. This may be accomplished as illustrated by connecting the sampling capacitor C1 to a unity gain buffer amplifier 22. The output of the unity gain buffer amplifier 22 is fed to the body/well 13 of the first switching MOS transistor T1. Accordingly, the buffer amplifier 22 removes the undesired effects of the parasitic diode as will be readily appreciated by those skilled in the art.

One possible disadvantage of the unity gain buffer amplifier 22 is that it may have a direct current (D.C.) offset, and this offset can be large considering that the buffer amplifier typically has a MOS transistor input stage. In addition, the first transistor T1 may also have a tendency to charge or discharge the sampling capacitor C1 based upon a sub-threshold conduction current. These difficulties may become pronounced for a S/H circuit which desirably has a relatively long holding time, such as, for example, several seconds. During such a long holding time, voltage droop may reduce the accuracy of the sampled value.

Another advantageous aspect of the present invention is the provision of the illustrated subthreshold conduction current compensation means or circuit 35 connected to the node between the first and second transistors T1, T2. The subthreshold conduction current compensation means 35 is for reducing undesired effects of subthreshold conduction current in the first FET T1 during the holding time. As shown in the illustrated embodiment, the subthreshold current conduction compensation means 35 preferably causes a voltage at a first conduction terminal of the first FET T1 at the node between the two transistors, to be substantially equal to a voltage at the second conduction terminal of the first FET during the holding time. The second conduction terminal of the first FET T1 is connected to the sampling capacitor C1.

As shown in the illustrated embodiment, the subthreshold conduction current compensation means 35 may connect the holding voltage from the output of the first buffer amplifier 22 to the node defined between a second conduction terminal of the second FET T2 and the first conduction terminal of the first FET T1 during the holding time. The first conduction terminal of the second transistor T2 is illustratively connected to receive the input signals. In addition, because both transistors T1, T2 are of the same conductivity type, a common control signal may operate the gates of the transistors T1, T2 as will be readily appreciated by those skilled in the art.

Another aspect of the invention relates to overcoming the difficulties that may be caused by the D.C. offset of the buffer amplifier 22, particularly for relatively long holding times on the order of several seconds, for example. The S/H circuit 31a includes amplifier offset compensation means or circuit 40 for compensating for the D.C. offset of the first buffer amplifier 22. Of course, the amplifier offset voltage compensation and the subthreshold conduction current compensation may be used together or individually, as will be readily appreciated by those skilled in the art.

The amplifier offset compensation means 40 may comprise as shown in the illustrated embodiment, offset determining means or circuit 41 for determining an offset voltage generated by the first buffer amplifier 22 and offset correction means or circuit 42 for generating an offset correction signal responsive to the offset determining means and coupling the offset correction signal to the first buffer amplifier.

The first buffer amplifier 22 may comprise a pair of inputs, that is, inverting (−) and non-inverting (+) inputs. Accordingly, as will be described in greater detail below with reference to the schematic circuit and timing diagrams of FIGS. 3 to 5, the offset determining means 41 may comprise means for connecting the pair of inputs to the sample voltage when determining the offset error. The offset determining means 41 may preferably comprise storing means for storing the offset voltage of the first buffer amplifier 22, and the storage means may be provided by a second S/H circuit including a second sampling capacitor and a second buffer amplifier as will also be described in greater detail below.

The offset correction means 42, as will be explained in greater detail below, may further comprise a differential amplifier having a first input connected to the second sampling capacitor, a second input connected to a reference voltage, and a pair of differential outputs connected to the first buffer amplifier 22. In addition, the amplifier offset compensation means 40 may include null sample means for sampling the offset voltage during a null time which is relatively brief, such as, for example, less than about 10 microseconds.

Figures 3, 4:
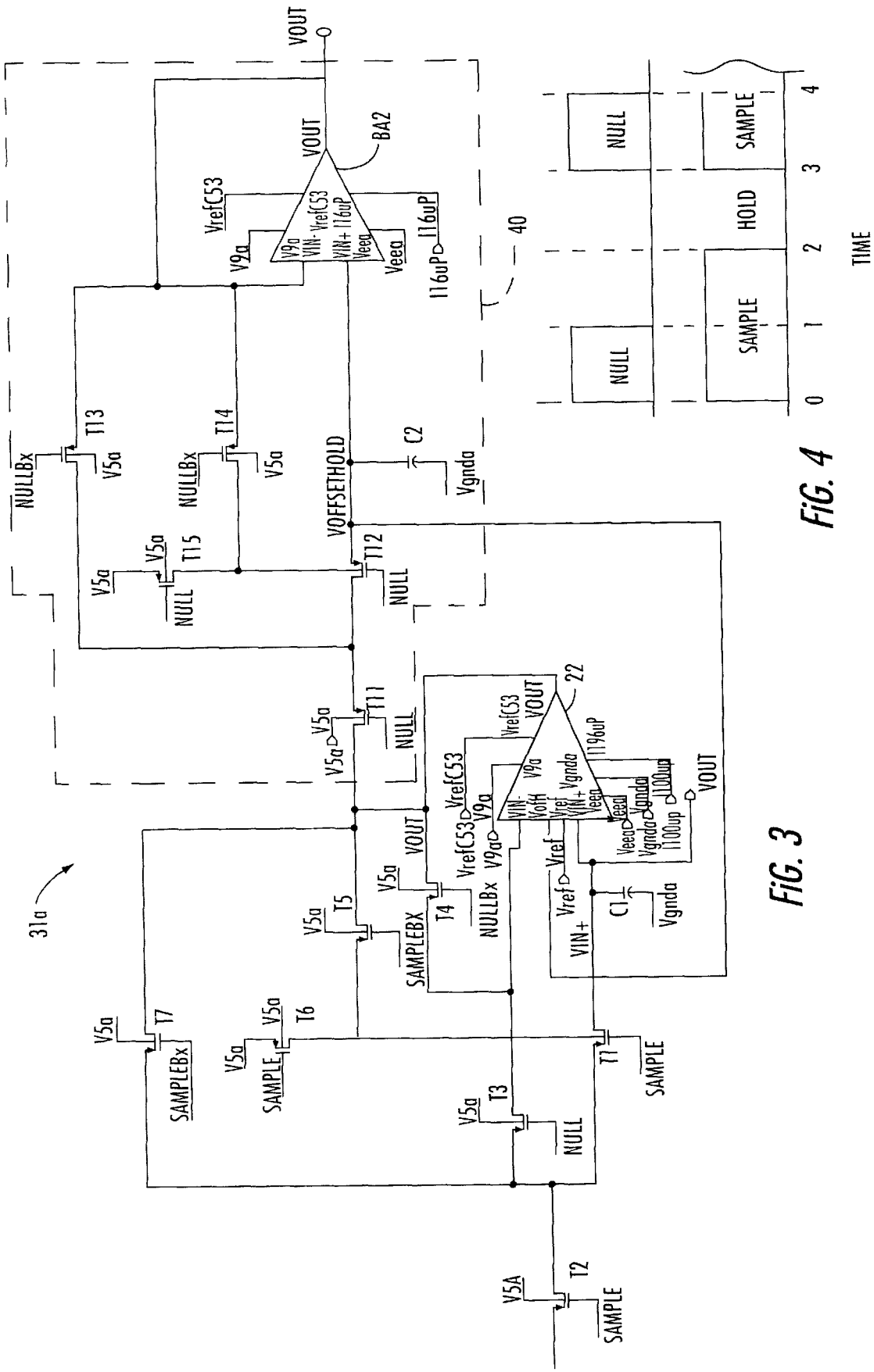
FIG. 3 is a schematic circuit diagram of the first S/H circuit as shown in FIG. 1.
FIG. 4 is a simplified timing diagram for the sample and null signals used in the S/H circuit as shown in FIG. 3.

Turning now additionally to FIGS. 3 and 4, further details of the S/H circuit 31a in accordance with the invention are explained. The first two transistors T1, T2 gate the input signal to the sampling capacitor C1 during a sampling time which is held for two schematically illustrated clock periods as shown in FIG. 4. During a first part of the sampling time, that is, during the null time, the offset voltage of the buffer amplifier 22 is determined. More particularly, transistor T3 connects the inverting input of the buffer amplifier 22 to the input voltage, while transistors T1, T2 are also driving the non-inverting input with the input voltage. Transistors T11, T12 also gate the output of the first buffer amplifier 22 to the second capacitor C2 which, in turn, is connected to the non-inverting input of the second amplifier BA2. The body of the transistor T12 is connected to the supply during the null period by transistor T15, and the node between transistors T11, T12 is connected to the output of the second amplifier BA2 by the transistor T13. During the null period, the offset correction voltage is stored on the second sampling capacitor C2 to serve as the correction input for the first amplifier 22.

During the second part of the sample time, and after the null period, the output of the first buffer amplifier 22 is fed back to the inverting input by the transistor T4. Transistors T3, T11, and T12 also turn off, and transistors T4, T13, and T14 are turned on and remain on even during the holding period. Also, during the holding period, transistors T1, T2, T6 are off, and transistors T7, T5 are on as will be readily appreciated by those skilled in the art. Of course, during the hold time, the voltage on the sampling capacitor C1 may be read as would also be readily appreciated by those skilled in the art. As would also be readily understood by those skilled in the art, positive or negative logic may be used in the S/H circuit 31a.

Figure 5:
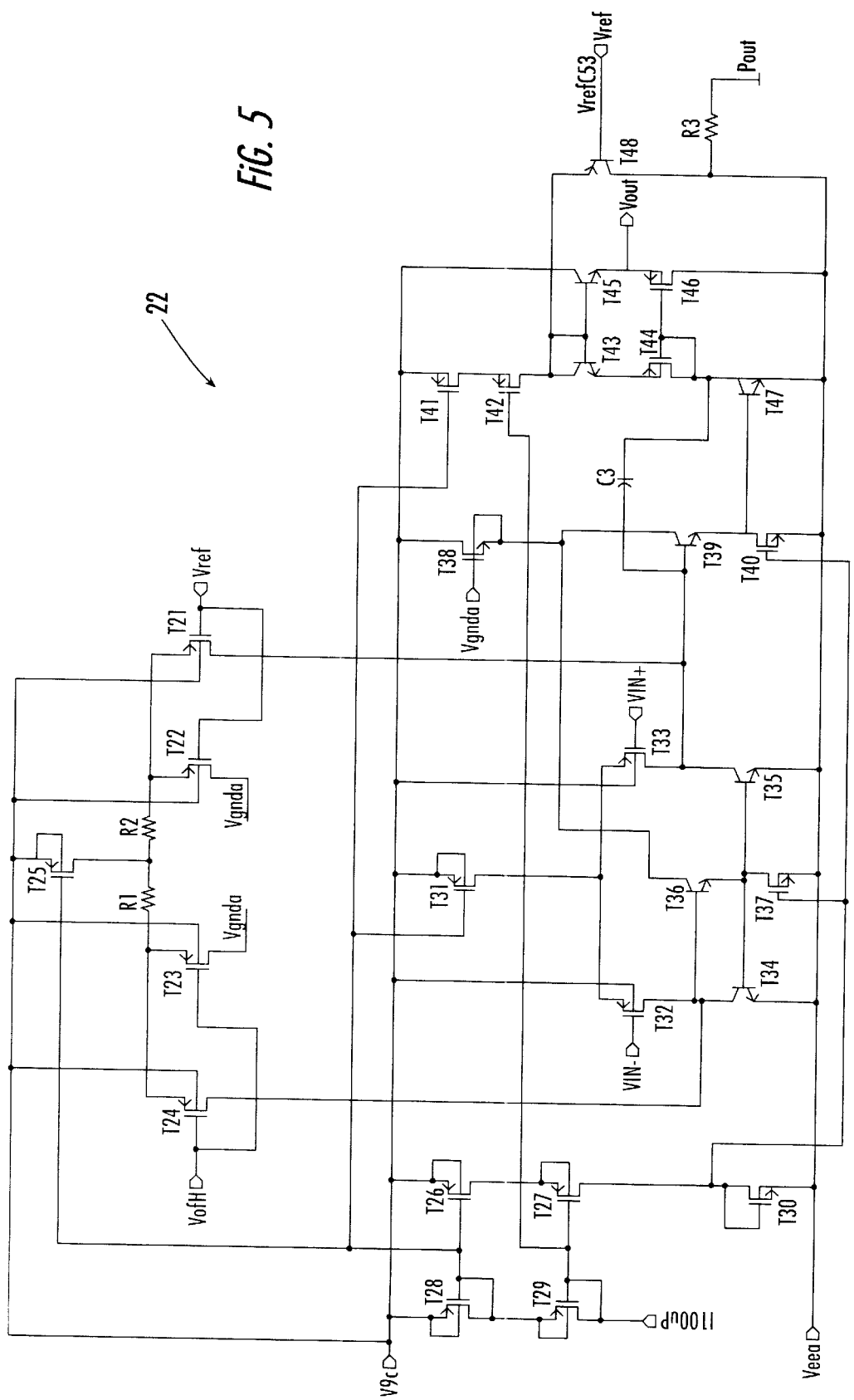
FIG. 5 is a schematic circuit diagram of the first buffer amplifier as shown in FIG. 3.

Turning now more particularly to FIG. 5, an embodiment of the buffer amplifier 22 is further described. As will be readily appreciated by those skilled in the art, the amplifier 22 is very similar to a 741 amplifier, but with two parallel input sections. It is preferably a high frequency amplifier (10 MHZ) with a typical gain of 80 dB.

The amplifier 22 may be considered as comprising the following five sections which are also described in greater detail below:

1. The bias section which is formed by devices T29, T28, T26, T27, T30, T40, T37, T41, T42 and T25.
2. A first front end section formed by devices T32, T33, T34, T35, T36, T39 and T47.
3. A second front end section formed by devices T24, T23, T22, and T21, and resistors R1 and R2.
4. An output section formed by devices T43, T44, T45 and T46.
5. A clamp section formed by device T48.

The amplifier 22 has two power rails. The positive supply is V9a, the negative supply is Veea, and current bias is provided at pin I100μP. For the illustrated embodiment, a +9 V positive supply and −5 V negative supply may be used with a bias current of 100 μAmp pulling to Veea. Resistor R3 may only need be used for computer simulations to connect Veea to the P substrate of the chip.

1. Bias Section.

A bias current of 100 μAmps is provided at pin I100μP. This current is a pull down current to Veea. The bias current is applied to two diode-connected PMOS devices T28 and T29, which then become the master in the current mirrors. This current is then mirrored to:

two PMOS devices T26 and T27, in turn, connected to a second diode-connected MOS device T30 which, in turn, becomes a master diode itself and is connected to T37 and T40 to provide pull down current for the input section of the amplifier;

T31 which provides the tail current of the first (main) input differential amplifier;

T41 and T42 which provide the bias current for the output stage; and

T25 which provides the tail current for the second (feedback) input differential amplifier.

2. First Input Section.

The first input section is formed by two input PMOS devices T32 and T33 that form the input differential pair. Two NPN devices T34 and T35 form the load for the input pair. An NPN device T36 provides the base current for the load devices T34 and T35. An NMOS device T37 functions as a pull down device to the bases of the load devices, to improve speed. Two NPN devices T39 and T47 load the right side of the input differential pair, matching T36 and T35 in the left side of the differential amplifier, with the NMOS device T40 also matching device T37 of the input differential pair. Device T47 is connected in a common emitter configuration so it also provides gain to the amplifier.

Capacitor C3 is used to provide frequency compensation to render the amplifier unity gain stable. An NMOS device T38 provides a pull up path for the devices T39 and T36 to the positive supply. Normally this is not necessary, but due to technology limitations of the NPN bipolar device, the NMOS device is used to make up for the voltage drop.

3. Second Input Section.

The input pair is formed by two PMOS devices T21 and T24. Two additional PMOS devices T22 and T23 are connected in parallel with the input devices T21 and T24 to reduce the gain of this stage. Two resistors RI and R2 are added to improve the matching and also reduce the gain. Device T25 of the bias circuit operates at a higher current level to make matching of the differential pair dependent more on the matching of the resistors than the MOS devices.

4. Output Section.

This section is a class AB output stage. A diode-connected NMOS device T44 is connected in series with an NPN bipolar device T43, with T47's collector providing the input signal. Devices T41 and T42 provide the bias current to this section. The current through devices T43 and T44 is mirrored to the actual output, NPN device T45 and PMOS device T46, which then connect to Vout, the output of the amplifier.

5. Clamp Section.

To avoid the output voltage from going above a set voltage, in this case set by VrefC53, a PNP bipolar device T48 is included in the circuit. This keeps the output Vout from going above a set output level.

Considering now the general operation of the amplifier 22, when the input voltages, VIN− and VIN+ are connected to the same voltage level, and external switches are closed, the amplifier is put into a non-inverting unity gain configuration around the second input section of the amplifier. This causes the null capacitor to store the reference level plus the offset of the amplifier. During operation, the unity gain feedback path around the second input section of the amplifier is opened, with the null capacitor having stored the reference voltage plus the offset. This in effect cancels the offset of the amplifier.

During operation, the other two inputs of the amplifier, VIN− and VIN+, are disconnected from a common voltage and connected into unity gain configuration around the main (first) input stage of the amplifier. The input signal is then applied to VIN+, the non-inverting input node. The null capacitor is always hard wired to the VofH of the second input stage.

One method aspect of the invention is for enhancing operation of an integrated S/H circuit 31a for an input signal. The S/H circuit 31a is preferably of a type comprising a first sampling capacitor C1, and a first field-effect transistor (FET) T1 having a first conduction terminal for receiving the input signal, a second conduction terminal connected to the first sampling capacitor, and a control terminal responsive to control signals for connecting the input signal to the first sampling capacitor during a sampling time and for disconnecting the input signal from the first sampling capacitor during a holding time. The S/H circuit 31a may further include a first buffer amplifier 22 having an input connected to the first sampling capacitor C1 and an output connected to the body of the first FET T1 during the holding time for applying a holding voltage from the first sampling capacitor to a body of the first FET.

Unfortunately, as described herein, the first buffer amplifier 22 may have a D.C. offset. Accordingly, the method preferably comprises the step of compensating for the D.C. offset of the first buffer amplifier 22. The compensating step may comprise determining an offset voltage generated by the first buffer amplifier 22, and generating an offset correction signal responsive to the offset determining means and coupling the offset correction signal to the first buffer amplifier.

Another aspect of the invention addresses the subthreshold conduction current of the first FET T1. In other words, the method preferably further includes the step of reducing undesired effects of subthreshold conduction current, such as by causing a voltage at the first conduction terminal of the first FET T1 to be substantially equal to a voltage at the second conduction terminal of the first FET during the holding time. For an embodiment wherein the S/H circuit 31a further comprises a second FET T2 having a first conduction terminal connected to the input signal, and a second conduction terminal connected to the first conduction terminal of the first FET, the step of compensating for the subthreshold conduction current preferably comprises connecting the holding voltage from the output of the first buffer amplifier 22 to a node defined between the second conduction terminal of the second FET and the first conduction terminal of the first FET during the holding time.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which is claimed is:

1. An integrated sample-and-hold (S/H) circuit for an input signal and comprising:

a substrate;

a first sampling capacitor formed on said substrate;

a first field-effect transistor (FET) formed on said substrate and having a first conduction terminal for receiving the input signal, a second conduction terminal connected to said first sampling capacitor, and a control terminal responsive to control signals for connecting the input signal to said first sampling capacitor during a sampling time and for disconnecting the input signal from said first sampling capacitor during a holding time, said first FET further comprising a body creating a parasitic diode-connected to said first sampling capacitor;

a first buffer amplifier having an input connected to said first sampling capacitor and an output connected to the body of said first FET during the holding time for applying a holding voltage from said first sampling capacitor to the body of said first FET to thereby reduce undesired effects from the parasitic diode, said first buffer amplifier having a direct current (D.C.) offset; and amplifier offset compensation means for compensating for the D.C. offset of said first buffer amplifier.

2. An integrated S/H circuit according to claim 1 wherein said amplifier offset compensation means comprises:

offset determining means for determining an offset voltage generated by said first buffer amplifier; and offset correction means for generating an offset correction signal responsive to said offset determining means and coupling the offset correction signal to said first buffer amplifier.

3. An integrated S/H circuit according to claim 2 wherein said first buffer amplifier comprises a pair of inputs; and wherein said offset determining means comprises means for connecting both inputs to the input voltage during a portion of the sampling time.

4. An integrated S/H circuit according to claim 2 wherein said offset determining means comprises storing means for storing the offset voltage of said first buffer amplifier.

5. An integrated S/H circuit according to claim 4 wherein said storing means comprises a second sampling capacitor and a second buffer amplifier connected thereto.

6. An integrated S/H circuit according to claim 5 wherein said offset correction means further comprises a differential amplifier having a first input connected to said second sampling capacitor, a second input connected to a reference voltage, and a pair of differential outputs connected to said first buffer amplifier.

7. An integrated S/H circuit according to claim 1 wherein said amplifier offset compensation means comprises null sample means for sampling the offset voltage during a null time occurring during a portion of the sample time.

8. An integrated S/H circuit according to claim 7 wherein said null sample means comprises means for sampling the offset voltage during a null time of less than about 10 microseconds.

9. An integrated S/H circuit according to claim 1 further comprising subthreshold conduction current compensation means for reducing undesired effects of subthreshold conduction current in said first FET during the holding time.

10. An integrated S/H circuit according to claim 9 wherein said subthreshold conduction current compensation means comprises means for causing a voltage at the first conduction terminal of said first FET to be substantially equal to a voltage at the second conduction terminal of the first FET during the holding time.

11. An integrated S/H circuit according to claim 9 further comprising a second FET having a first conduction terminal connected to the input signal, a second conduction terminal connected to the first conduction terminal of said first FET, and a control terminal responsive to control signals for connecting the input signal to said first sampling capacitor during the sampling time and for disconnecting the input signal from said first sampling capacitor during the holding time.

12. An integrated S/H circuit according to claim 11 wherein said subthreshold conduction current compensation means further comprises means for connecting the holding voltage from the output of said first buffer amplifier to a node defined between the second conduction terminal of said second FET and the first conduction terminal of said first FET during the holding time.

13. An integrated S/H circuit according to claim 1 wherein said first buffer amplifier has a gain of substantially one.

14. An integrated S/H circuit according to claim 1 further comprising an output amplifier connected to said first sampling capacitor for generating an output signal based upon the holding voltage on said first sampling capacitor.

15. An integrated S/H circuit according to claim 1 wherein said first buffer amplifier comprises an FET input stage.

16. An integrated sample-and-hold (S/H) circuit for an input signal and comprising:

a substrate;

a first sampling capacitor formed on said substrate;

a first field-effect transistor (FET) formed on said substrate and having a first conduction terminal for receiving the input signal, a second conduction terminal connected to said first sampling capacitor, and a control terminal responsive to control signals for connecting the input signal to said first sampling capacitor during a sampling time and for disconnecting the input signal from said first sampling capacitor during a holding time;

a first buffer amplifier having an input connected to said first sampling capacitor and an output connected to the body of said first FET during the holding time for applying a holding voltage from said first sampling capacitor to the body of said first FET, said first buffer amplifier having a direct current (D.C.) offset;

offset determining means for determining an offset voltage generated by said first buffer amplifier; and offset correction means for generating an offset correction signal responsive to said offset determining means and coupling the offset correction signal to said first buffer amplifier.

17. An integrated S/H circuit according to claim 16 wherein said first buffer amplifier comprises a pair of inputs; and wherein said offset determining means comprises means for connecting both inputs to the input voltage during a portion of the sampling time.

18. An integrated S/H circuit according to claim 16 wherein said offset determining means comprises storing means for storing the offset voltage of said first buffer amplifier.

19. An integrated S/H circuit according to claim 18 wherein said storing means comprises a second sampling capacitor and a second buffer amplifier connected thereto.

20. An integrated S/H circuit according to claim 19 wherein said offset correction means further comprises a differential amplifier having a first input connected to said second sampling capacitor, a second input connected to a reference voltage, and a pair of differential outputs connected to said first buffer amplifier.

21. An integrated S/H circuit according to claim 16 wherein said amplifier offset compensation means comprises null sample means for sampling the offset voltage during a null time occurring during a portion of the sample time.

22. An integrated S/H circuit according to claim 21 wherein said null sample means comprises means for sampling the offset voltage during a null time of less than about 10 microseconds.

23. An integrated S/H circuit according to claim 16 further comprising subthreshold conduction current compensation means for reducing undesired effects of subthreshold conduction current in said first FET during the holding time.

24. An integrated S/H circuit according to claim 23 wherein said subthreshold conduction current compensation means comprises means for causing a voltage at the first conduction terminal of said first FET to be substantially equal to a voltage at the second conduction terminal of the first FET during the holding time.

25. An integrated S/H circuit according to claim 23 further comprising a second FET having a first conduction terminal connected to the input signal, a second conduction terminal connected to the first conduction terminal of said first FET, and a control terminal responsive to control signals for connecting the input signal to said first sampling capacitor during the sampling time and for disconnecting the input signal from said first sampling capacitor during the holding time.

26. An integrated S/H circuit according to claim 25 wherein said subthreshold conduction current compensation means further comprises means for connecting the holding voltage from the output of said first buffer amplifier to a node defined between the second conduction terminal of said second FET and the first conduction terminal of said first FET during the holding time.

27. An integrated S/H circuit according to claim 16 wherein said first buffer amplifier comprises an FET input stage.

28. An integrated sample-and-hold (S/H) circuit for an input signal and comprising:
   a first sampling capacitor;
   a first field-effect transistor (FET) having a first conduction terminal for receiving the input signal, a second conduction terminal connected to said first sampling capacitor, and a control terminal responsive to control signals for connecting the input signal to said first sampling capacitor during a sampling time and for disconnecting the input signal from said first sampling capacitor during a holding time;
   a first buffer amplifier having an input connected to said first sampling capacitor and an output connected to the body of said first FET during the holding time for applying a holding voltage from said first sampling capacitor to the body of said first FET to thereby reduce undesired effects from the parasitic diode, said first buffer amplifier having a direct current (D.C.) offset;
   amplifier offset compensation means for compensating for the D.C. offset of said first buffer amplifier; and
   subthreshold conduction current compensation means for reducing undesired effects of subthreshold conduction current in said first FET during the holding time.

29. An integrated S/H circuit according to claim 28 wherein said amplifier offset compensation means comprises:
   offset determining means for determining an offset voltage generated by said first buffer amplifier; and
   offset correction means for generating an offset correction signal responsive to said offset determining means and coupling the offset correction signal to said first buffer amplifier.

30. An integrated S/H circuit according to claim 29 wherein said first buffer amplifier comprises a pair of inputs; and wherein said offset determining means comprises means for connecting both inputs to the holding voltage during a portion of the sampling time.

31. An integrated S/H circuit according to claim 29 wherein said offset determining means comprises storing means for storing the offset voltage of said first buffer amplifier.

32. An integrated S/H circuit according to claim 31 wherein said storing means comprises a second sampling capacitor and a second buffer amplifier connected thereto.

33. An integrated S/H circuit according to claim 32 wherein said offset correction means further comprises a differential amplifier having a first input connected to said second sampling capacitor, a second input connected to a reference voltage, and a pair of differential outputs connected to said first buffer amplifier.

34. An integrated S/H circuit according to claim 29 wherein said subthreshold conduction current compensation means comprises means for causing a voltage at the first conduction terminal of said first FET to be substantially equal to a voltage at the second conduction terminal of the first FET during the holding time.

35. An integrated S/H circuit according to claim 29 further comprising a second FET having a first conduction terminal connected to the input signal, a second conduction terminal connected to the first conduction terminal of said first FET, and a control terminal responsive to control signals for connecting the input signal to said first sampling capacitor during the sampling time and for disconnecting the input signal from said first sampling capacitor during the holding time.

36. An integrated S/H circuit according to claim 35 wherein said subthreshold conduction current compensation means further comprises means for connecting the holding voltage from the output of said first buffer amplifier to a node defined between the second conduction terminal of said second FET and the first conduction terminal of said first FET during the holding time.

37. An integrated S/H circuit according to claim 29 wherein said first buffer amplifier comprises an FET input stage.

38. A method for enhancing operation of an integrated sample-and-hold (S/H) circuit for an input signal, the S/H circuit of a type comprising a first sampling capacitor, a first field-effect transistor (FET) having a first conduction terminal for receiving the input signal, a second conduction terminal connected to said first sampling capacitor, and a control terminal responsive to control signals for connecting the input signal to said first sampling capacitor during a sampling time and for disconnecting the input signal from said first sampling capacitor during a holding time, the S/H circuit further comprising a first buffer amplifier having an input connected to said first sampling capacitor and an output connected to the body of said first FET during the holding time for applying a holding voltage from said first sampling capacitor to a body of said first FET, said first buffer amplifier having a direct current (D.C.) offset, the method comprising the step of:
   compensating for the D.C. offset of said first buffer amplifier.

39. A method according to claim 38 wherein compensating step comprises:
   determining an offset voltage generated by said first buffer amplifier; and
   generating an offset correction signal responsive to said offset determining means and coupling the offset correction signal to said first buffer amplifier.

40. A method according to claim 39 wherein said first buffer amplifier comprises a pair of inputs; and wherein the step of determining the offset comprises connecting both inputs to the input voltage during a portion of the sampling time.

41. A method according to claim 39 wherein the step of determining the offset comprises storing the offset voltage of said first buffer amplifier.

42. A method according to claim 41 wherein the step of storing comprises storing the offset voltage using second sampling capacitor and a second buffer amplifier connected thereto.

43. A method according to claim 39 wherein the step of compensating comprises sampling the offset voltage during a null time occurring during a portion of the sampling time.

44. A method according to claim 43 wherein the step of sampling during the null time comprises sampling during a null time of less than about 10 microseconds.

45. A method according to claim 38 further comprising the step of reducing undesired effects of subthreshold conduction current in said first FET during the holding time.

46. A method according to claim 45 wherein the step of reducing undesired effects of subthreshold conduction current comprises causing a voltage at the first conduction terminal of said first FET to be substantially equal to a voltage at the second conduction terminal of the first FET during the holding time.

47. A method according to claim 46 wherein said S/H circuit further comprises a second FET having a first conduction terminal connected to the input signal, a second conduction terminal connected to the first conduction terminal of said first FET, and a control terminal responsive to control signals for connecting the input signal to said first sampling capacitor during the sampling time and for disconnecting the input signal from said first sampling capacitor during the holding time; and wherein the step of compensating for the subthreshold conduction current comprises connecting the holding voltage from the output of said buffer amplifier to a node defined between the second conduction terminal of said second FET and the first conduction terminal of said first FET during the holding time.

48. A method according to claim 38 further comprising the step of generating an output signal based upon the holding voltage on said first sampling capacitor by connecting an output amplifier to said first sampling capacitor.

\* \* \* \* \*